US012607940B2

(12) United States Patent
Lee et al.

(10) Patent No.: US 12,607,940 B2
(45) Date of Patent: Apr. 21, 2026

(54) RETICLE MASKING DEVICE, SUBSTRATE PROCESSING APPARATUS INCLUDING THE SAME, AND SUBSTRATE PROCESSING METHOD USING THE SAME

(71) Applicant: Samsung Electronics Co., Ltd.,
Suwon-si (KR)

(72) Inventors: Sanghwan Lee, Suwon-si (KR);
Dohyung Kim, Suwon-si (KR);
Jinhong Park, Suwon-si (KR);
Sungbin Jeon, Suwon-si (KR)

(73) Assignee: **SAMSUNG ELECTRONICS CO.,
LTD.**, Suwon-si (KR)

(*) Notice: Subject to any disclaimer, the term of this patent is extended or adjusted under 35 U.S.C. 154(b) by 101 days.

(21) Appl. No.: 18/618,345

(22) Filed: Mar. 27, 2024

(65) Prior Publication Data

US 2025/0102926 A1      Mar. 27, 2025

(30) Foreign Application Priority Data

Sep. 26, 2023    (KR) ........................ 10-2023-0129055

(51) Int. Cl.
*G03F 7/00*          (2006.01)

(52) U.S. Cl.
CPC .......... *G03F 7/70066* (2013.01); *G03F 7/702*
(2013.01); *G03F 7/7085* (2013.01)

(58) Field of Classification Search
CPC .. G03F 7/70833; G03F 7/70033; G03F 7/702;
G03F 7/70233; G03F 7/70716; G03F
7/7085; G03F 7/70558; G03F 7/70066;
G03F 7/70133; G03F 1/42; G03F
7/70058; G03F 7/70083; G03F 7/70141;
G03F 7/70175; G03F 7/70191; G03F
7/70591; G03F 7/706; G03F 7/70858;
G03F 7/70891; G03F 7/70941; G03F
7/70808;
(Continued)

(56) References Cited

U.S. PATENT DOCUMENTS

| | | |
|---|---|---|
| 6,894,285 B2 | 5/2005 | Kleinschmidt et al. |
| 8,537,332 B2 | 9/2013 | Freimann |

(Continued)

FOREIGN PATENT DOCUMENTS

| | | | |
|---|---|---|---|
| JP | 2006303270 A | * | 11/2006 |
| KR | 10-2024-0106729 A | | 7/2024 |

OTHER PUBLICATIONS

English translation of JP2006-303270, published Nov. 2, 2006.
(Year: 2006).*

*Primary Examiner* — Christina A Riddle
(74) *Attorney, Agent, or Firm* — Muir Patent Law, PLLC

(57) ABSTRACT

Disclosed are a reticle masking device, a substrate processing apparatus, and a substrate processing method. The reticle masking device comprises a first masking device that provides a mask hole, a second masking device that is movable in a first direction with respect to the first masking device, and an optical sensor device coupled to the second masking device. The second masking device provides a slit vertically penetrates the second masking device and that overlaps the mask hole. The optical sensor device includes a first sensor fixedly coupled to a bottom surface of the second masking device, and a second sensor that stands opposite to the first sensor across the slit and is fixedly coupled to the bottom surface of the second masking device.

20 Claims, 14 Drawing Sheets

(58) Field of Classification Search
CPC ............. G03F 7/70816; G03F 7/70825; G03F
7/70841; G03F 7/70908; G03F 7/70916;
G03F 7/70925; G03F 7/70933; G03F
7/70975; G03F 7/70983; G03F 7/70991;
G03F 7/7015; G03F 7/70091; G03F
7/70125; G01J 1/04; G01J 1/0411; G01J
1/0437; G01J 1/4228; G01J 1/4257; G01J
1/429; H01S 3/005; H05G 2/00–0094
USPC ...................... 355/18, 30, 52–55, 66–77, 133
See application file for complete search history.

(56) References Cited

U.S. PATENT DOCUMENTS

| | | | |
|---|---|---|---|
| 10,871,713 B2 | 12/2020 | Cho et al. | |
| 11,221,564 B2 | 1/2022 | Lu et al. | |
| 11,656,555 B2 | 5/2023 | Nath et al. | |
| 2001/0028448 A1* | 10/2001 | Mori ................... | G03F 7/70558 |
| | | | 355/53 |
| 2003/0169411 A1* | 9/2003 | Ota ..................... | G03F 7/70233 |
| | | | 355/53 |
| 2011/0235015 A1* | 9/2011 | Dengel ............... | G03F 7/70141 |
| | | | 355/71 |
| 2020/0133142 A1* | 4/2020 | Lu ....................... | G03F 7/70891 |
| 2022/0206397 A1 | 6/2022 | Beerens et al. | |
| 2024/0069443 A1* | 2/2024 | Kim ................... | G03F 7/70075 |
| 2024/0219848 A1 | 7/2024 | Lee et al. | |

* cited by examiner

RETICLE MASKING DEVICE, SUBSTRATE PROCESSING APPARATUS INCLUDING THE SAME, AND SUBSTRATE PROCESSING METHOD USING THE SAME

CROSS-REFERENCE TO RELATED APPLICATION

This U.S. nonprovisional application claims priority under 35 U.S.C. § 119 to Korean Patent Application No. 10-2023-0129055 filed on Sep. 26, 2023, in the Korean Intellectual Property Office, the disclosure of which is hereby incorporated by reference in its entirety.

BACKGROUND

The present inventive concepts relate to a reticle masking device, a substrate processing apparatus including the same, and a substrate processing method using the same, and more particularly, to a reticle masking device capable of exactly measuring intensity of extreme ultraviolet (EUV), a substrate processing apparatus including the same, and a substrate processing method using the same.

A semiconductor device may be fabricated through various processes. For example, the semiconductor device may be manufactured through a photolithography process, an etching process, a deposition process, and a plating process. An extreme ultraviolet (EUV) source may be used to generate an EUV radiation during an exposure process for fabricating a semiconductor device. The EUV radiation produced from the EUV source may be reflected from a reticle and irradiated to a substrate. Therefore, a pattern may be formed on the substrate.

SUMMARY

Some embodiments of the present inventive concepts provide a reticle masking device capable of ascertaining positions of contamination, a substrate processing apparatus including the same, and a substrate processing method using the same.

Some embodiments of the present inventive concepts provide a reticle masking device capable of measuring EUV intensity at each region, a substrate processing apparatus including the same, and a substrate processing method using the same.

Some embodiments of the present inventive concepts provide a reticle masking device capable of exactly measuring EUV radiation by simple design change, a substrate processing apparatus including the same, and a substrate processing method using the same.

The object of the present inventive concepts is not limited to the mentioned above, and other objects which have not been mentioned above will be clearly understood to those skilled in the art from the following description.

According to some embodiments of the present inventive concepts, a reticle masking device may comprise: a first masking device including a mask hole; a second masking device that is movable in a first direction with respect to the first masking device, the first direction being a horizontal direction; and an optical sensor device coupled to the second masking device. The second masking device includes a slit that vertically penetrates the second masking device and overlaps the mask hole. The optical sensor device may include: a first sensor fixedly coupled to a bottom surface of the second masking device; and a second sensor disposed opposite to the first sensor across the slit and fixedly coupled to the bottom surface of the second masking device.

According to some embodiments of the present inventive concepts, a substrate processing apparatus may comprise: an extreme ultraviolet (EUV) source; a reticle stage configured to support a reticle; a substrate stage configured to support a substrate; and a reticle masking device between the EUV source and the reticle stage. The reticle masking device may include: a first masking device including a mask hole; a second masking device including a slit overlapping the mask hole, the second masking device being movable in a first direction as a horizontal direction; and an optical sensor device fixedly coupled to the second masking device and movable in the first direction together with the second masking device. The optical sensor device includes a first sensor on one side of the slit.

According to some embodiments of the present inventive concepts, a substrate processing method may comprise: placing a substrate in a substrate processing apparatus; irradiating an extreme ultraviolet (EUV) radiation to the substrate; and measuring the EUV radiation. The substrate processing apparatus may include: an EUV source; a reticle stage that supports a reticle; a substrate stage that supports the substrate; and a reticle masking device between the EUV source and the reticle stage. The reticle masking device may include an optical sensor device that is movable in a first direction as a horizontal direction. The optical sensor device may include a first sensor. The step of measuring the EUV radiation may include: allowing the reticle to receive the EUV radiation generated from the EUV source; allowing the first sensor to measure the EUV radiation irradiated to the reticle; and driving the first sensor to move in the first direction.

Details of other example embodiments are included in the description and drawings.

BRIEF DESCRIPTION OF DRAWINGS

FIG. 5 illustrates a bottom view partially showing a substrate processing apparatus according to some example embodiments of the present inventive concepts.

FIGS. 8 to 13 illustrate diagrams showing a substrate processing method according to the flow chart of FIG. 6.

DETAILED DESCRIPTION OF EMBODIMENTS

Figure 1:
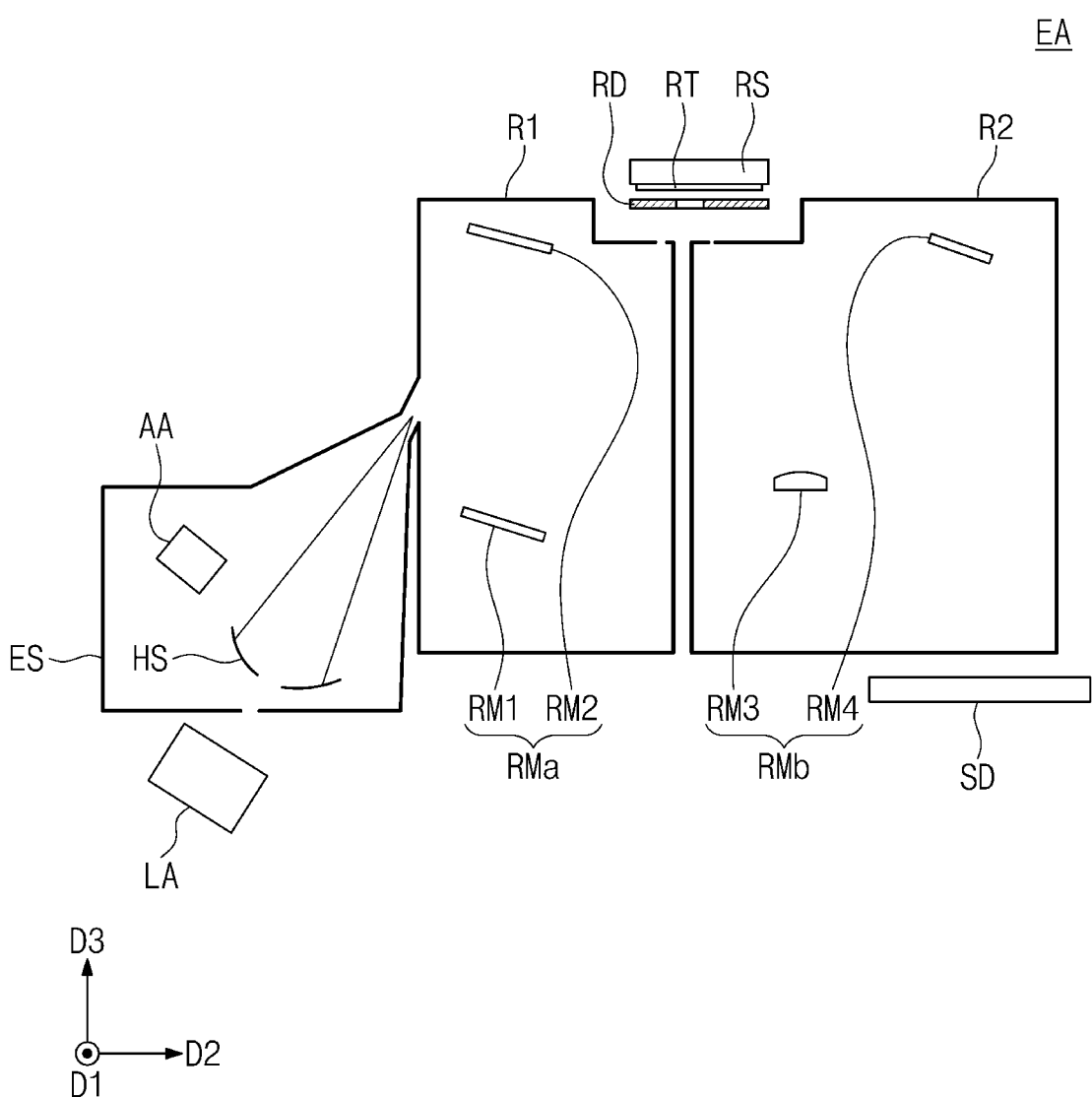
FIG. 1 illustrates a cross-sectional view showing a substrate processing apparatus according to some example embodiments of the present inventive concepts.

The following will now describe some embodiments of the present inventive concepts with reference to the accompanying drawings. Like reference numerals refer to like components throughout the description.

FIG. 1 illustrates a cross-sectional view showing a substrate processing apparatus according to some example embodiments of the present inventive concepts. In this description, symbol D1 may indicate a first direction, symbol D2 may indicate a second direction that intersects the first direction D1, and symbol D3 may indicate a third direction that intersects each of the first direction D1 and the second direction D2. Each of the first direction D1 and the second direction D2 may be called a horizontal direction. The third direction D3 may be called a vertical direction. Each of the first direction D1, the second direction D2, and the third direction D3 may be perpendicular to one another.

Referring to FIG. 1, a substrate processing apparatus EA may be provided. The substrate processing apparatus EA may be an apparatus for providing a substrate with light to form a pattern on the substrate. In this description, the term "substrate" may include a silicon (Si) wafer, but the present inventive concepts are not limited thereto. In example embodiments, the substrate processing apparatus EA may be configured to irradiate an extreme ultraviolet (EUV) radiation to a substrate and to form a pattern on the substrate. The substrate processing apparatus EA may include an EUV source ES, a reticle stage RS, a reticle masking device RD, a substrate stage SD, a first reflection section R1, and a second reflection section R2.

The EUV source ES may generate an EUV radiation. The EUV source ES may include a housing HS, a laser generator LA, and a fluid supply device AA. The housing HS may provide an internal space (not designated by reference numeral) in which the EUV radiation is generated. The laser generator LA may be connected to the housing HS. The laser generator LA may provide a laser to the internal space of the housing HS. The fluid supply device AA may be connected to the housing HS. The fluid supply device AA may provide a fluid to the internal space of the housing HS. For example, the fluid supply device AA may be fluidly connected to the housing HS. As used herein, items described as being "fluidly connected" are configured such that a liquid or gas can flow, or be passed, from one item to the other. When a laser is irradiated to the fluid provided from the fluid supply device AA into the housing HS, the EUV radiation may be generated.

The first reflection section R1 may be positioned between the EUV source ES and the reticle stage RS and/or between the EUV source ES and the reticle masking device RD. The first reflection section R1 may guide a transit path of the EUV radiation generated from the EUV source ES. For example, the first reflection section R1 may reflect the EUV radiation, which is generated from the EUV source ES, to propagate toward the reticle stage RS and guide the EUV radiation to travel to the reticle RT. The first reflection section R1 may include a plurality of optical members RMa. For example, the first reflection section R1 may include a first optical member RM1 and a second optical member RM2. Each of the plurality of optical members RMa may include a mirror and/or a lens.

The second reflection section R2 may be positioned between the substrate stage SD and the reticle stage RS and/or between the substrate stage SD and the reticle masking device RD. The second reflection section R2 may guide a transit path of the EUV radiation that is reflected from the reticle RT. For example, the second reflection section R2 may reflect the EUV radiation, which is reflected from the reticle RT, to travel to a substrate on the substrate stage SD. The second reflection section R2 may include a plurality of optical members RMb. For example, the second reflection section R2 may include a third optical member RM3 and a fourth optical member RM4. Each of the plurality of optical members RMb may include a mirror and/or a lens.

The reticle stage RS may support the reticle RT. The reticle stage RS may use various ways to support the reticle RT. For example, the reticle stage RS may use an electrostatic force to rigidly place the reticle RT on a bottom surface of the reticle stage RS. In this case, the reticle stage RS may include an electrostatic chuck (ESC). The present inventive concepts, however, are not limited thereto, and the reticle stage RS may hold a substrate by using one or more of a vacuum pressure and a clamp. A pattern formed on the reticle RT on the reticle stage RS may be transferred to a substrate on the substrate stage SD.

The reticle masking device RD may be positioned between the EUV source ES and the reticle stage RS. The reticle masking device RD may cause the reticle RT on the reticle stage RS to receive only a portion of the EUV radiation generated from the EUV source ES. For example, the reticle masking device RD may shield another portion of the EUV radiation generated from the EUV source ES. A detailed description thereof will be further discussed below.

The substrate stage SD may support a substrate. For example, a substrate may be disposed on the substrate stage SD. The substrate stage SD may use various ways to hold a substrate. For example, the substrate stage SD may include an electrostatic chuck (ESC) in which an electrostatic force is used to hold a substrate. The present inventive concepts, however, are not limited thereto, and the substrate stage SD may hold a substrate by using one or more of a vacuum pressure and a clamp.

Figure 2:
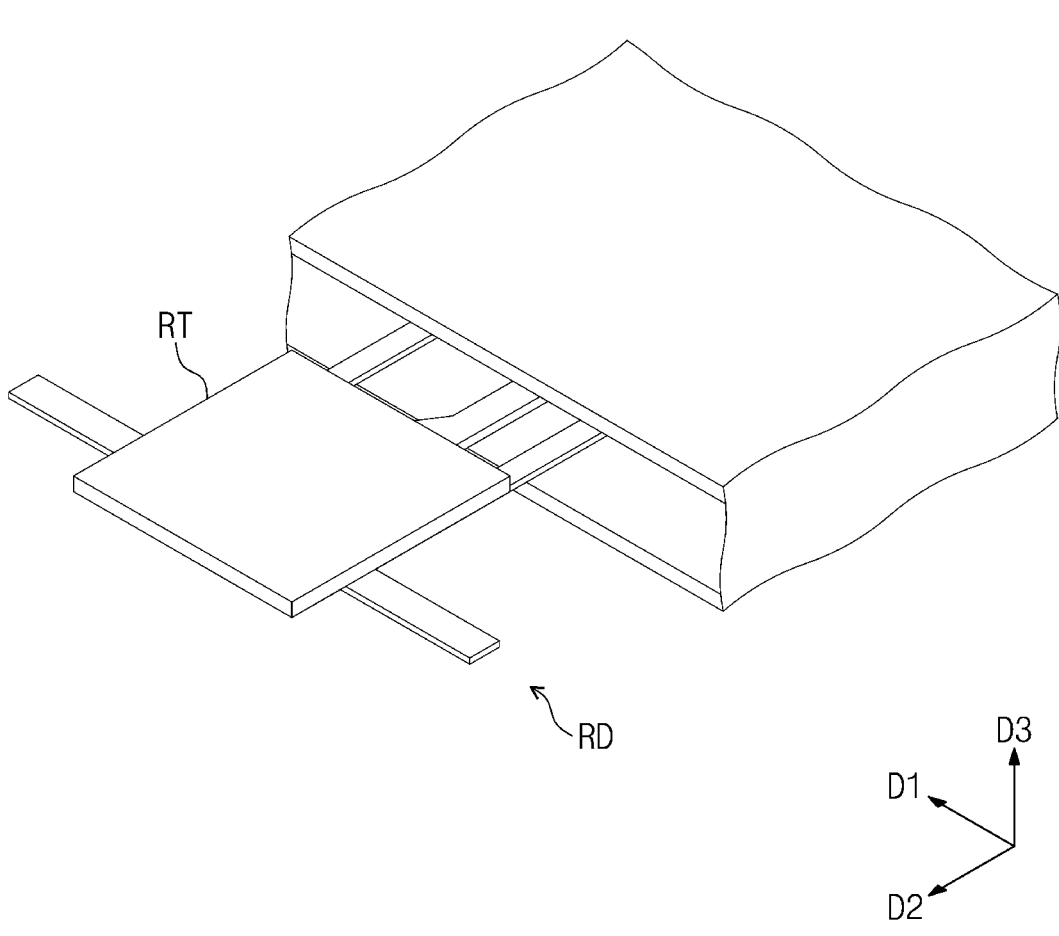
FIG. 2 illustrates a perspective view partially showing a substrate processing apparatus according to some example embodiments of the present inventive concepts.
Figure 3:
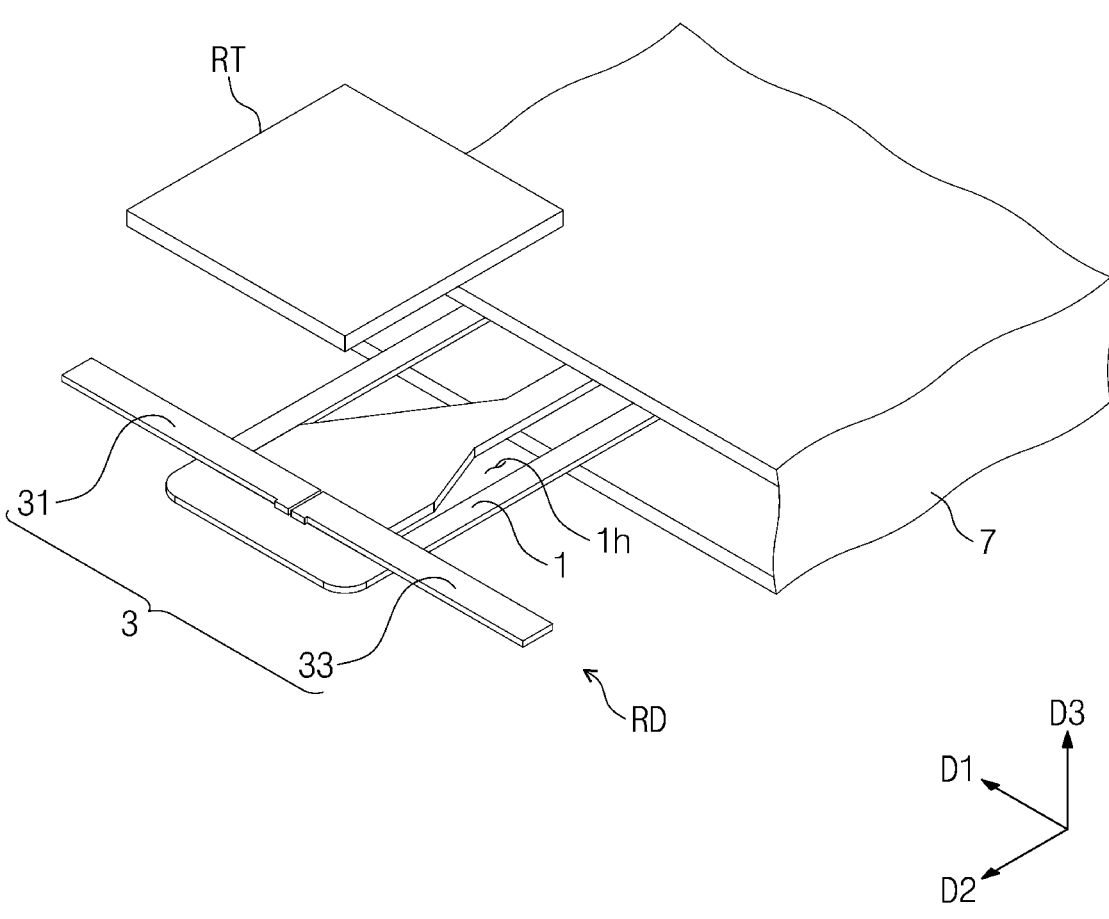
FIG. 3 illustrates an exploded perspective view showing a substrate processing apparatus according to some example embodiments of the present inventive concepts.
Figure 4:
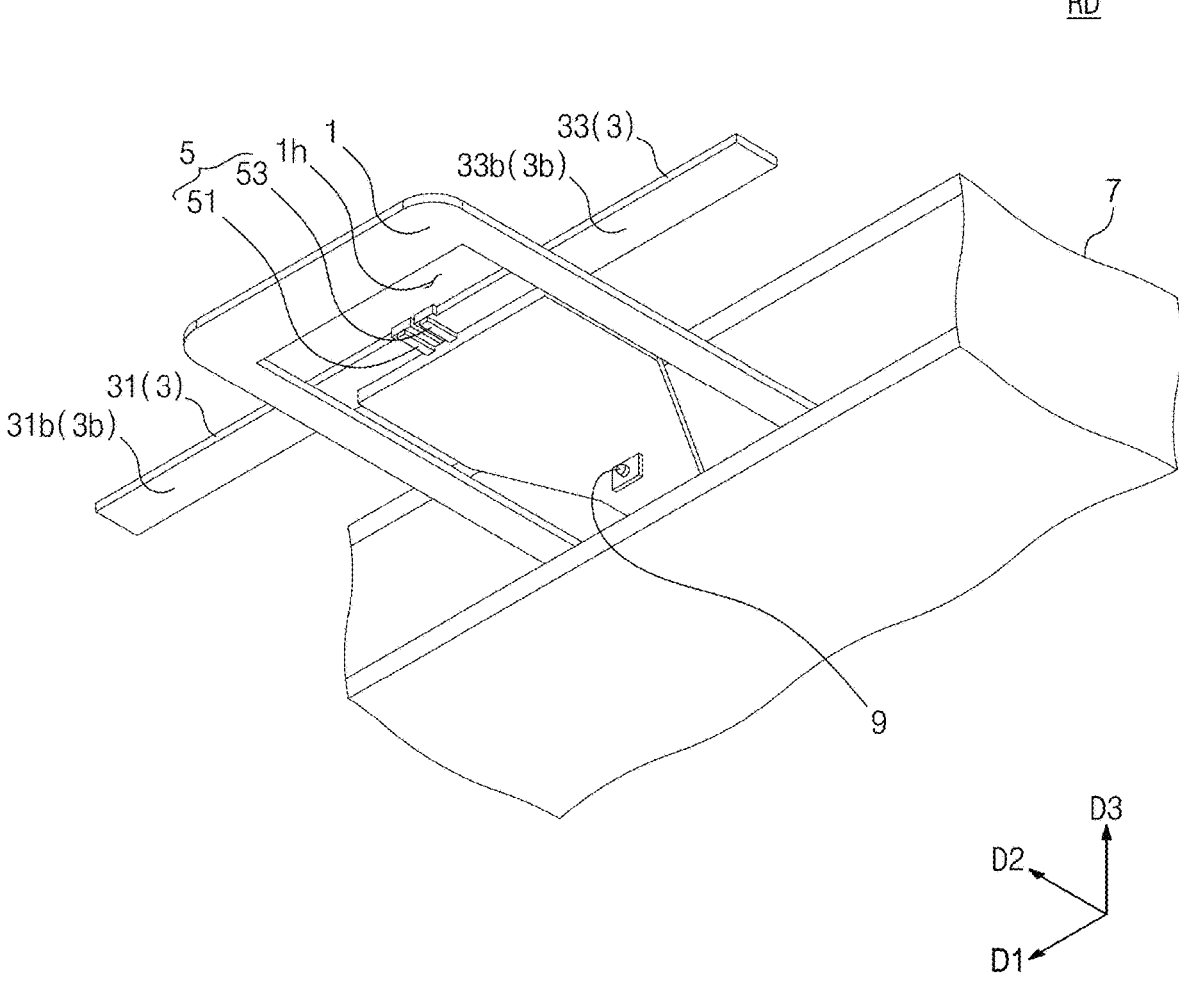
FIG. 4 illustrates a perspective view partially showing a substrate processing apparatus according to some example embodiments of the present inventive concepts.
Figure 5:
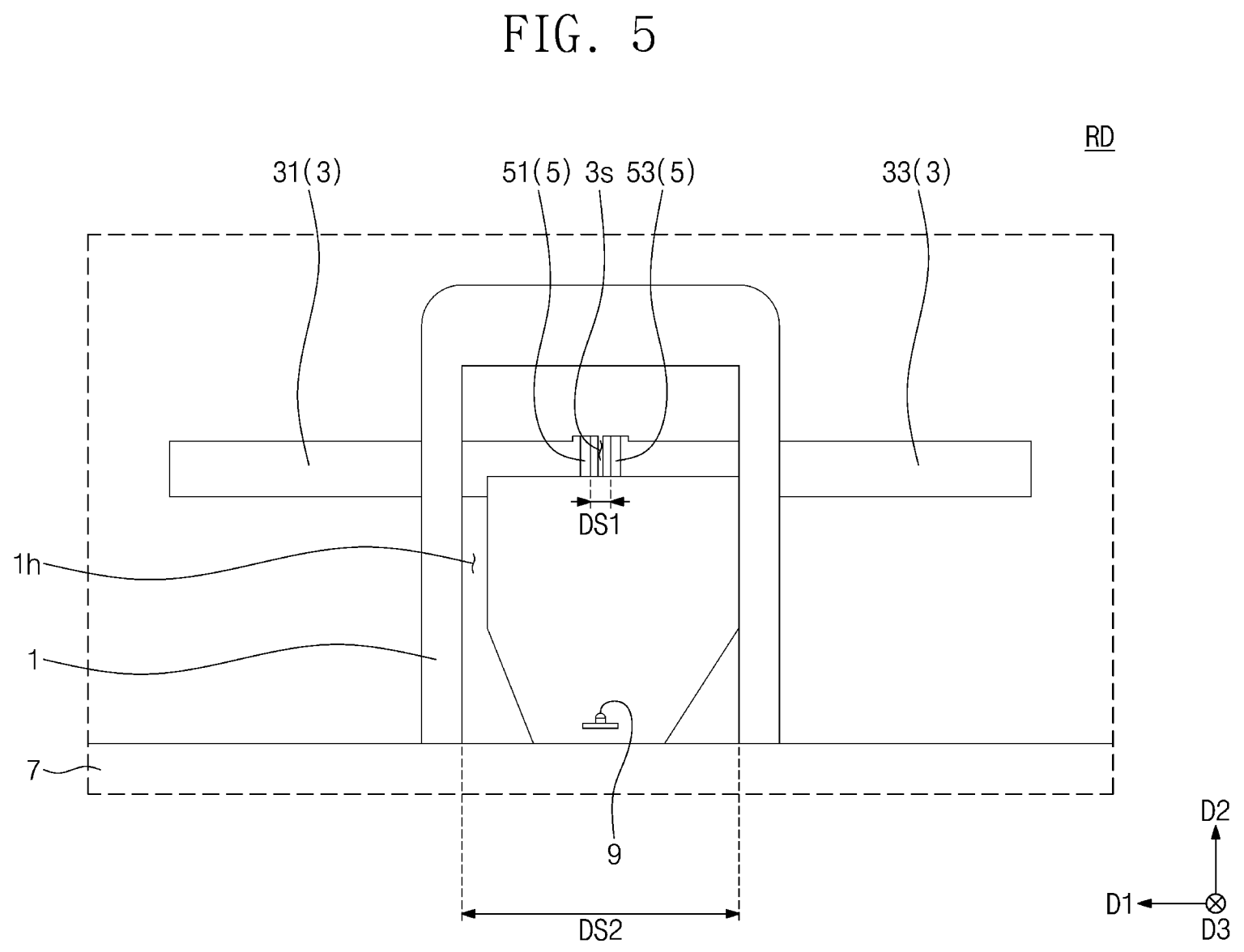

FIG. 2 illustrates a perspective view partially showing a substrate processing apparatus according to some example embodiments of the present inventive concepts. FIG. 3 illustrates an exploded perspective view showing a substrate processing apparatus according to some example embodiments of the present inventive concepts. FIG. 4 illustrates a perspective view partially showing a substrate processing apparatus according to some example embodiments of the present inventive concepts. FIG. 5 illustrates a bottom view partially showing a substrate processing apparatus according to some example embodiments of the present inventive concepts.

Referring to FIGS. 2 to 5, the reticle RT may be disposed on the reticle masking device RD. The reticle masking device RD may shield a portion of the EUV radiation directed toward the reticle RT. The reticle masking device RD may measure the EUV radiation directed toward the reticle RT. The reticle masking device RD may include a first masking device 1, a second masking device 3, an optical sensor device 5, a driving mechanism 7, and a monitoring sensor 9.

The first masking device 1 may provide a mask hole 1*h*. The first masking device 1 may be a frame that defines the mask hole 1*h*. The mask hole 1*h* may vertically penetrate the first masking device 1. The mask hole 1*h* may have, for example, a polygonal shape. For example, the mask hole 1*h* may have a tetragonal shape when viewed in plan. The first masking device 1 may be movable. For example, the first masking device 1 may be movable in the second direction D2. For example, the first masking device 1 may move toward the driving mechanism 7 and/or away from the driving mechanism 7. The first masking device 1 may be connected to the driving mechanism 7.

The second masking device 3 may provide a slit 3*s*. The slit 3*s* may vertically penetrate the second masking device 3.

The slit 3s may overlap the mask hole 1h. For example, when viewed in plan, at least a portion of the slit 3s may overlap the mask hole 1h. The second masking device 3 may be movable. For example, the second masking device 3 may be movable in a horizontal direction with respect to the first masking device 1. The second masking device 3 may be movable in the first direction D1. The second masking device 3 may be connected to the driving mechanism 7. The second masking device 3 may be positioned on the first masking device 1. The second masking device 3 may be connected to the first masking device 1. For example, the second masking device 3 may be fixedly coupled to the first masking device 1. The second masking device 3 may be positioned on a top surface of the first masking device 1, but the present inventive concepts are not limited thereto. The second masking device 3 may include a first member 31 and a second member 33. The first member 31 may be disposed spaced apart in the first direction D1 from the second member 33. The slit 3s may be defined between the first member 31 and the second member 33. For example, between the first member 31 and the second member 33, the slit 3s may be defined by an inner lateral surface of the first member 31 and an inner lateral surface of the second member 33. An interval between the first member 31 and the second member 33 may be a width of the slit 3s. Each of the first member 31 and the second member 33 may extend lengthwise in the first direction D1. A size of the mask hole 1h may be greater than that of the slit 3s. For example, an area of the slit 3s may be less than that of the mask hole 1h in plan view.

The optical sensor device 5 may be movable. For example, the optical sensor device 5 may be movable in the first direction D1. The optical sensor device 5 may be movable in the first direction D1 together with the second masking device 3. The optical sensor device 5 may be fixedly coupled to the second masking device 3. The optical sensor device 5 may measure the EUV radiation, while moving in a horizontal direction (e.g., in the first direction D1). The optical sensor device 5 may include a first sensor 51 and a second sensor 53.

The first sensor 51 may be coupled to the second masking device 3. For example, on one side of the slit 3s, the first sensor 51 may be fixedly coupled to a bottom surface 3b of the second masking device 3. Thus, the first sensor 51 may be movable together with the second masking device 3. The first sensor 51 may be, for example, fixedly coupled to a bottom surface 31b of the first member 31. The first sensor 51 may measure the EUV radiation that passes through the slit 3s. The first sensor 51 may include a photodiode (PD), but the present inventive concepts are not limited thereto.

The second sensor 53 may be coupled to the second masking device 3. For example, on another side of the slit 3s, the second sensor 53 may be fixedly coupled to the second masking device 3. In this case, on a side opposite to that on which the first sensor 51 is positioned across the slit 3s, the second sensor 53 may be fixedly coupled to the bottom surface 3b of the second masking device 3. Thus, the second sensor 53 may be movable together with the second masking device 3. The second sensor 53 may be, for example, fixedly coupled to a bottom surface 33b of the second member 33. The second sensor 53 may measure the EUV radiation that passes through the slit 3s. The second sensor 53 may include a photodiode (PD), but the present inventive concepts are not limited thereto.

A first distance DS1 may be defined to indicate a distance in the first direction D1 between the first sensor 51 and the second sensor 53. A second distance DS2 may be defined to indicate a distance in the first direction D1 of the mask hole 1h. A third distance (not designated by reference numeral) may be defined to indicate a distance in the first direction D1 of the slit 3s. The second distance DS2 may be greater than each of the first distance DS1 and the third distance. The first distance DS1 may be about 1.0 times to about 2.5 times the third distance, but the present inventive concepts are not limited thereto.

The driving mechanism 7 may move the first masking device 1 and/or the second masking device 3. The driving mechanism 7 may be connected to the first masking device 1 and/or the second masking device 3. For example, the driving mechanism 7 may drive the first masking device 1 to move in the second direction D2. The driving mechanism 7 may drive the second masking device 3 to move in the first direction D1. The driving mechanism 7 may include an actuator, such as a motor or a hydraulic device, and/or a power transmission device, such as a rail or a belt, but the present inventive concepts are not limited thereto.

The monitoring sensor 9 may monitor the optical sensor device 5. The monitoring sensor 9 may include a photodiode directed toward the first sensor 51 and/or the second sensor 53. The monitoring sensor 9 may be disposed on a bottom surface of the first masking device 1, but the present inventive concepts are not limited thereto. The monitoring sensor 9 may detect contamination of the first sensor 51 and/or the second sensor 53.

In some embodiments, a cleaning fluid sprayer may be provided around the reticle masking device RD. The cleaning fluid sprayer may spray a cleaning fluid that cleans the optical sensor device 5. For example, the cleaning fluid sprayer may supply hydrogen radicals for cleaning the first sensor 51 and/or the second sensor 53. In this case, the cleaning fluid sprayer may be a hydrogen radical generator (HRG). When the monitoring sensor 9 detects contamination of the optical sensor device 5, the cleaning fluid sprayer may operate to spray hydrogen radicals to the first sensor 51 and/or the second sensor 53. The hydrogen radicals sprayed from the cleaning fluid sprayer may clean the first sensor 51 and/or the second sensor 53.

Figure 6:
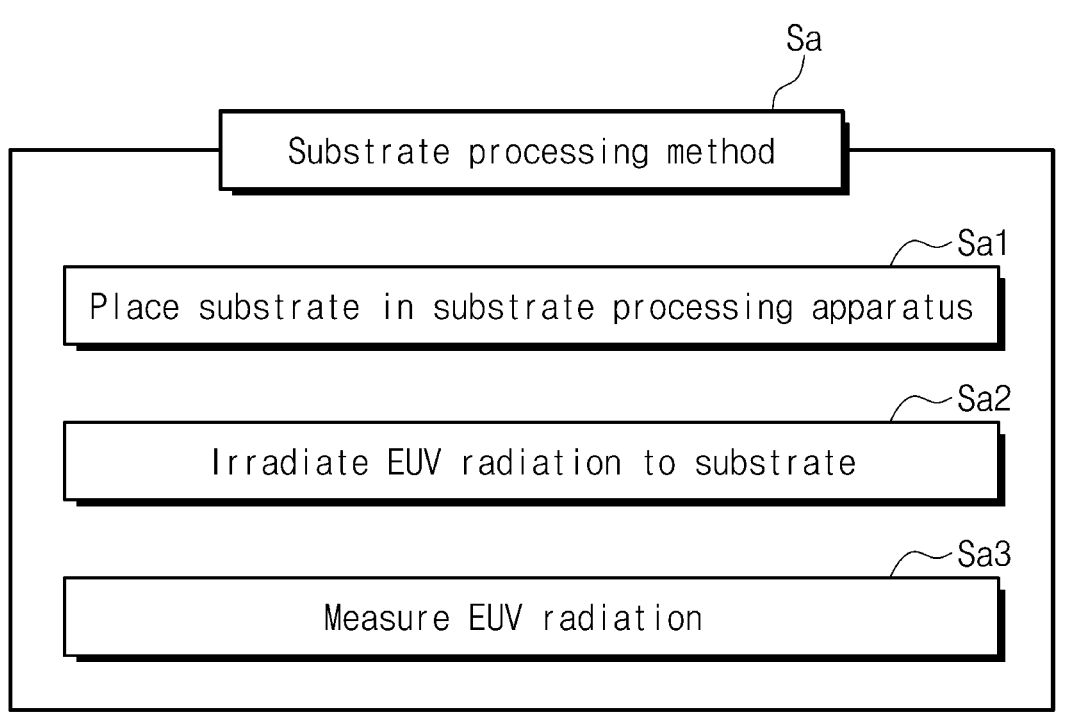
FIG. 6 illustrates a flow chart showing a substrate processing method according to some example embodiments of the present inventive concepts.

FIG. 6 illustrates a flow chart showing a substrate processing method according to some example embodiments of the present inventive concepts.

Referring to FIG. 6, a substrate processing method Sa may be provided. The substrate processing method Sa may be a way of processing a substrate by using the substrate processing apparatus EA discussed with reference to FIGS. 1 to 5. The substrate processing method Sa may include placing a substrate in a substrate processing apparatus (Sa1), irradiating an extreme ultraviolet (EUV) radiation to the substrate (Sa2), and measuring the EUV radiation (Sa3).

Figure 7:
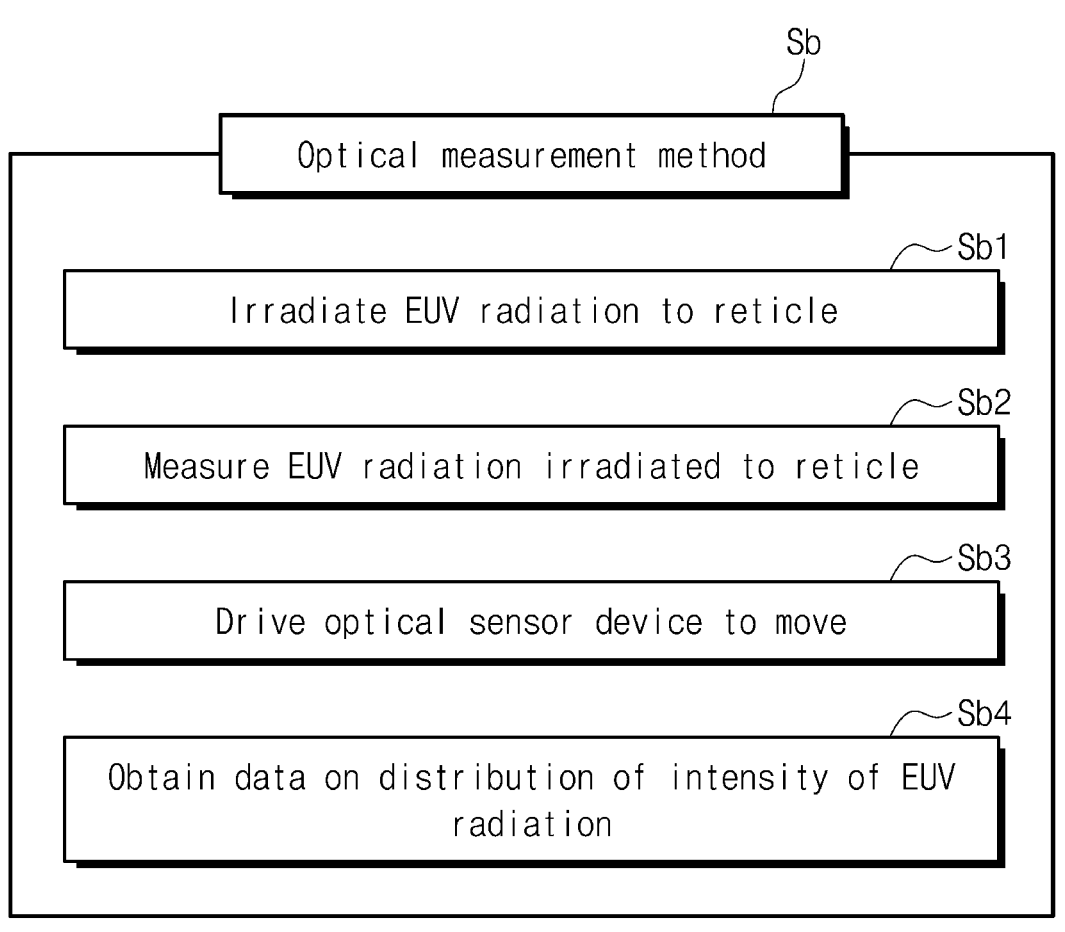
FIG. 7 illustrates a flow chart showing an optical measurement method according to some example embodiments of the present inventive concepts.

FIG. 7 illustrates a flow chart showing an optical measurement method according to some example embodiments of the present inventive concepts.

Referring to FIG. 7, an optical measurement method Sb may be provided. The optical measurement method Sb may be a way of performing the EUV measurement step Sa3 discussed with reference to FIG. 6. The optical measurement method Sb may include irradiating the EUV radiation to a reticle (Sb1), measuring the EUV radiation irradiated to the reticle (Sb2), driving an optical sensor device to move (Sb3), and obtaining data on distribution of intensity of the EUV radiation (Sb4).

The substrate processing method Sa of FIG. 6 and the optical measurement method Sb of FIG. 7 will be further discussed in detail below with reference to FIGS. 8 to 14.

Figure 14:
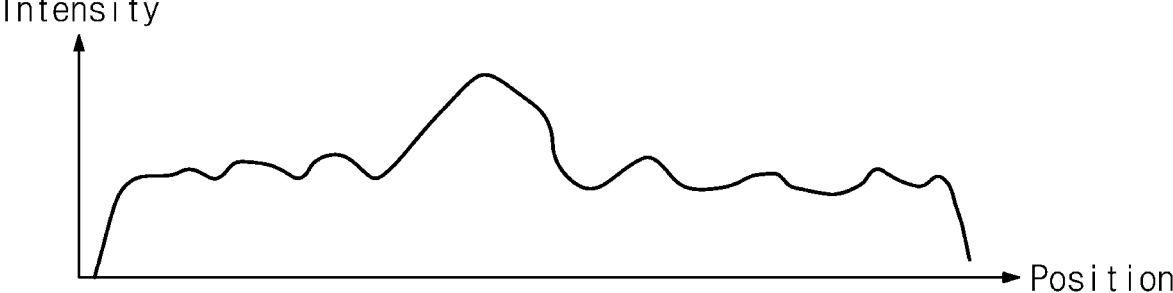
FIG. 14 illustrates a graph showing data obtained by the optical measurement method according to the flow chart of FIG. 6.

FIGS. 8 to 13 illustrate diagrams showing a substrate processing method according to the flow chart of FIG. 6. FIG. 14 illustrates a graph showing data obtained by the optical measurement method according to the flow chart of FIG. 6.

Figure 8:
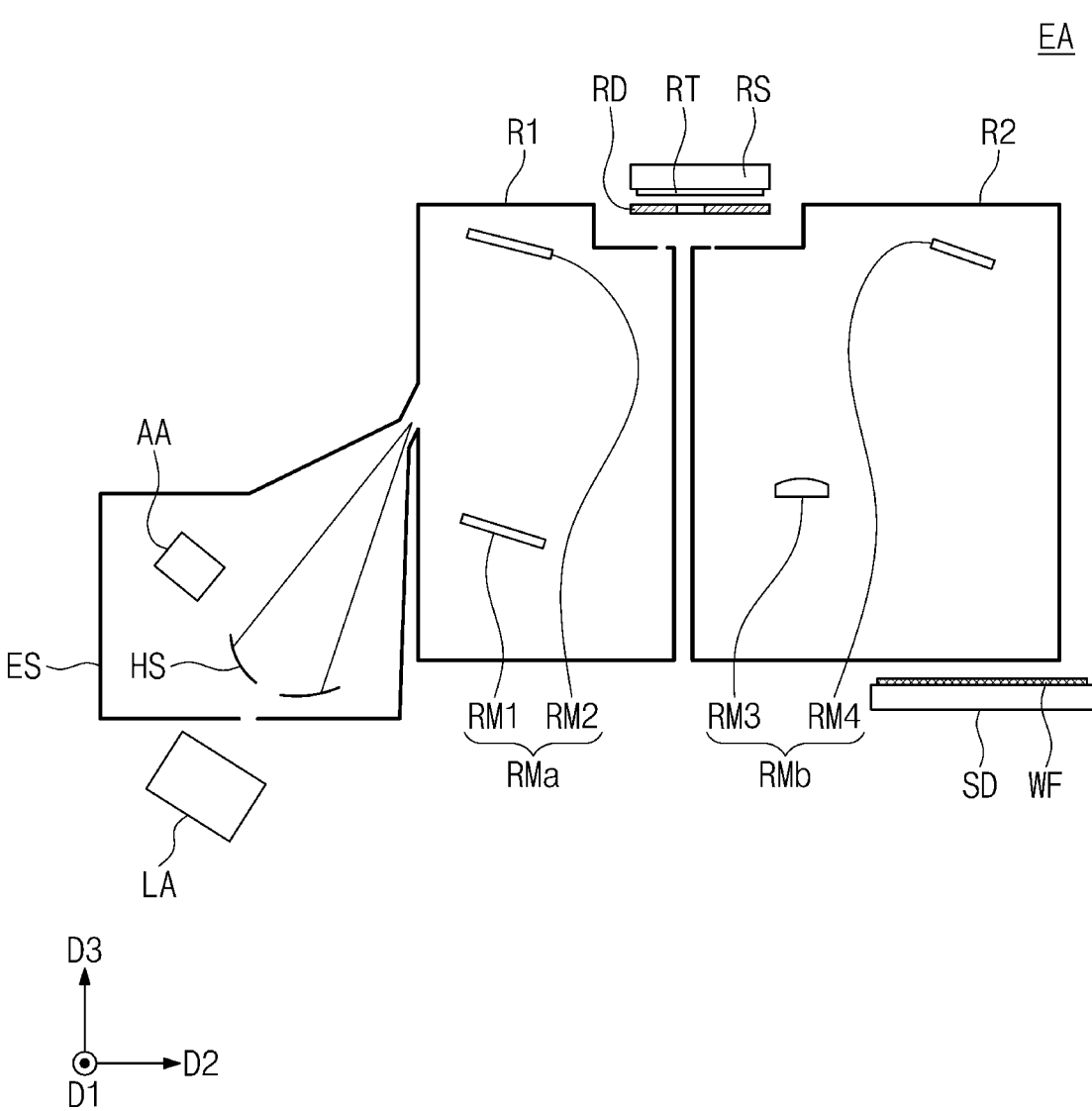

Referring to FIGS. 6 and 8, the substrate placement step Sa1 may include placing a substrate WF on the substrate stage SD. The substrate WF may be held on the substrate stage SD. The reticle RT may be fixedly coupled to the reticle stage RS.

Figure 9:
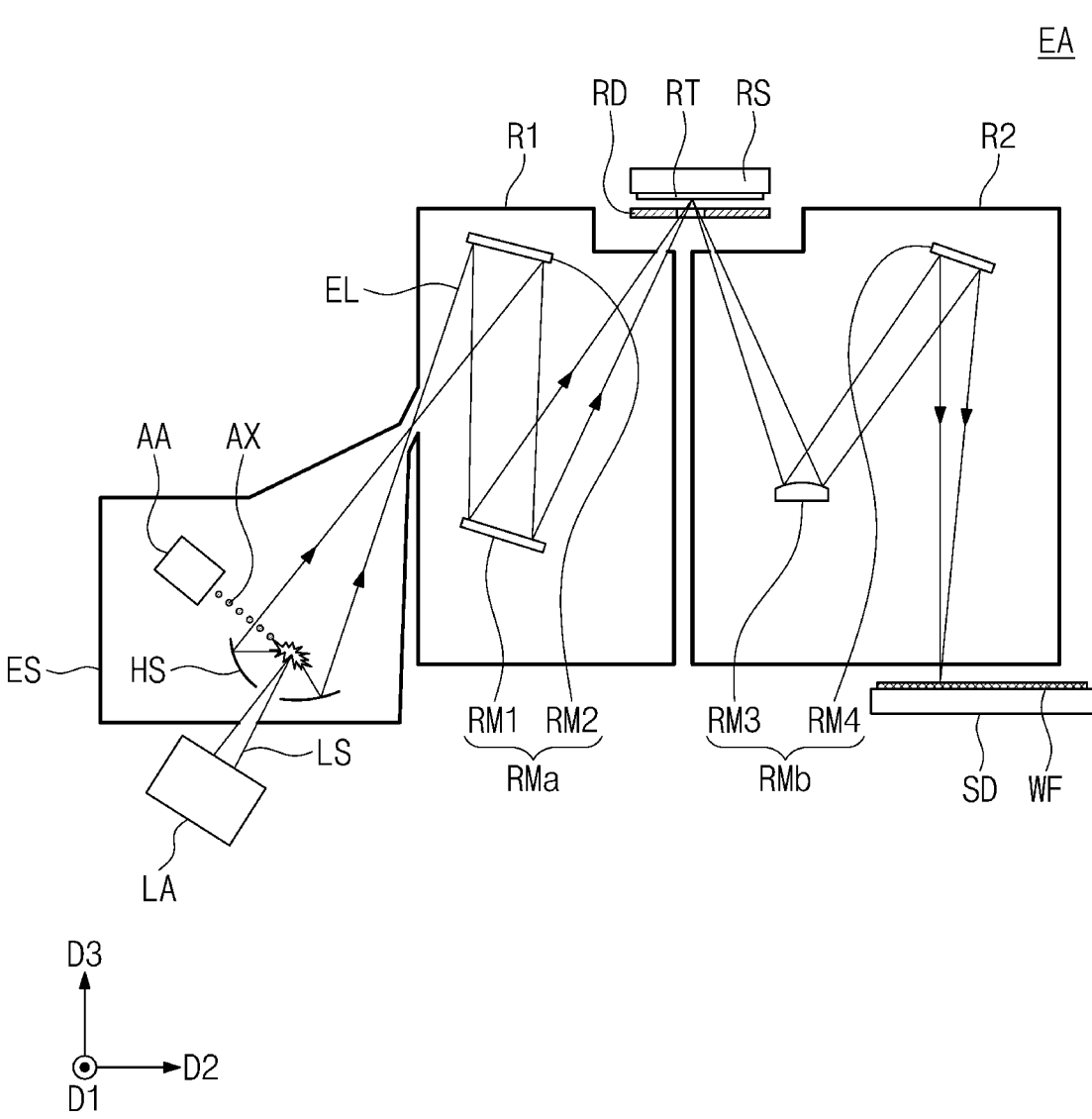

Referring to FIGS. 6 and 9, the EUV irradiation step Sa2 may include allowing the EUV source ES to generate an extreme ultraviolet (EUV) radiation EL. For example, after the fluid supply device AA provides the housing HS with a fluid AX including tin (Sn) particles, when the laser generator LA irradiates a laser LS to the housing HS, the EUV radiation EL may be generated. The EUV radiation EL may be irradiated to the reticle RT through the first reflection section R1 and the reticle masking device RD. The EUV radiation EL may be reflected from the reticle RT, and may be irradiated through the second reflection section R2 to the substrate WF. Therefore, a pattern may be formed on the substrate WF.

Figure 10:
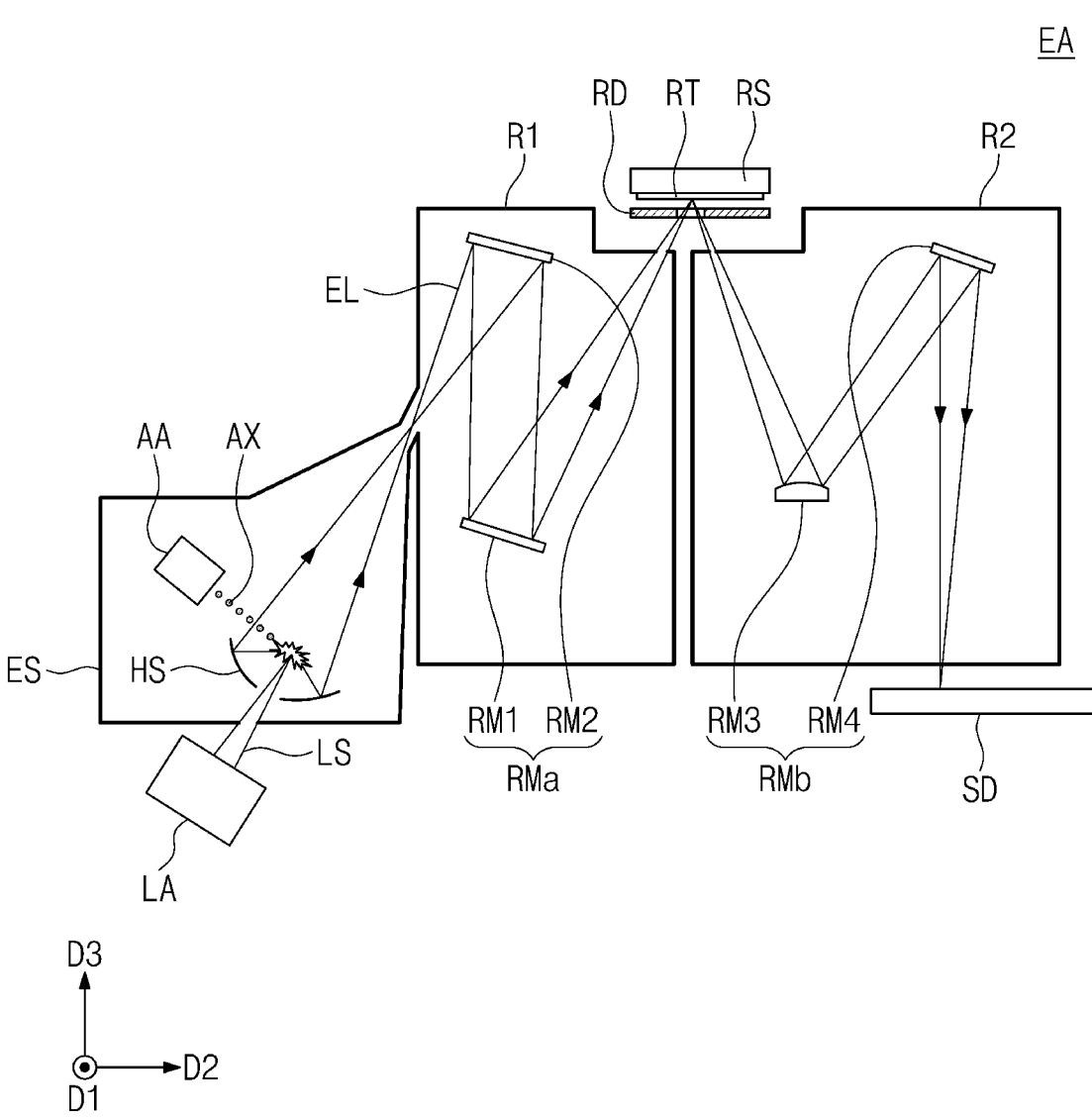

Referring to FIGS. 6 and 10, the EUV measurement step Sa3 may include irradiating the EUV radiation EL toward the reticle stage RS. The EUV measurement step Sa3 may be performed in a state where the substrate WF is removed from the substrate stage SD, but the present inventive concepts are not limited thereto.

Figure 11:
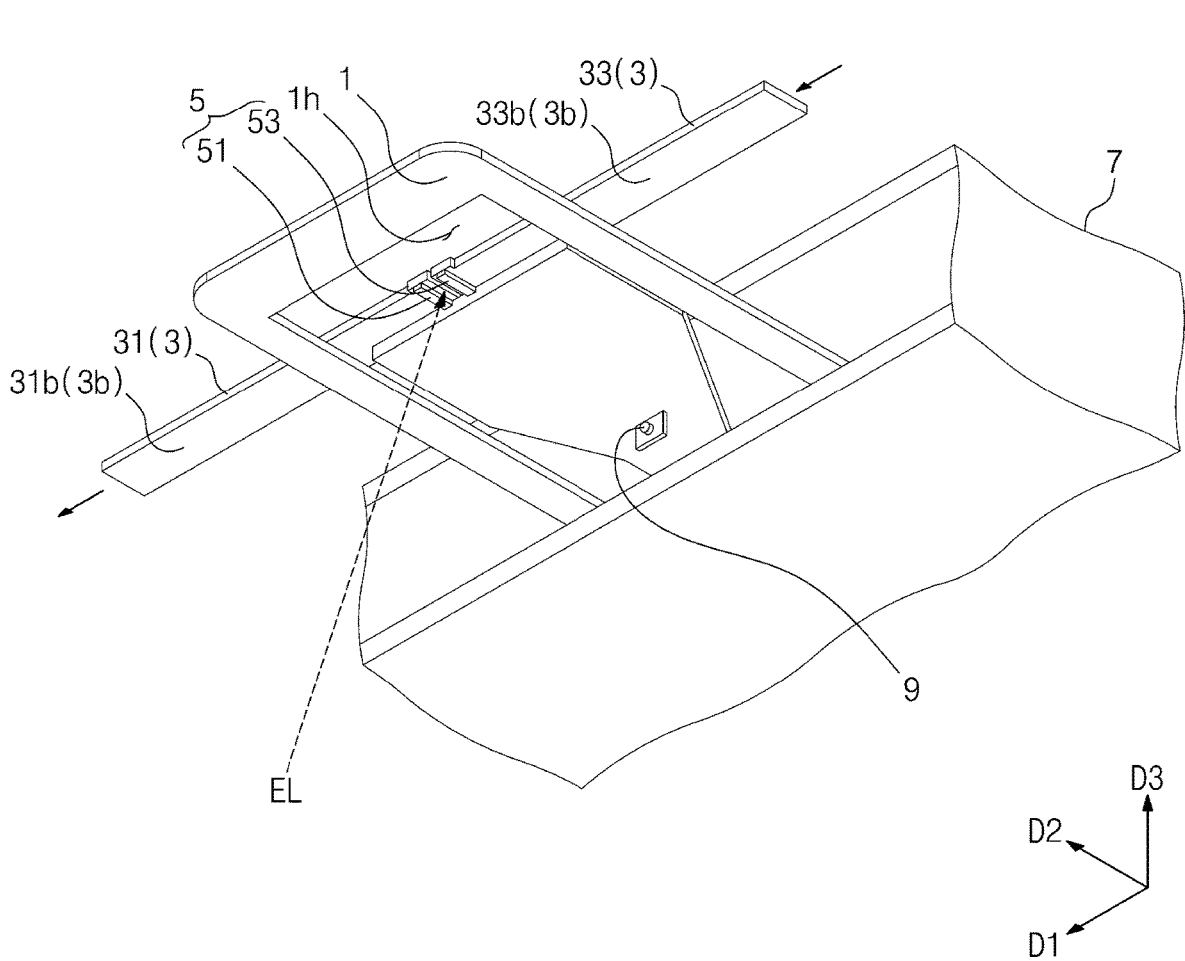

Referring to FIGS. 7 and 11, the EUV irradiation step Sb1 may include allowing the EUV radiation EL to pass through the reticle masking device RD. For example, the EUV radiation EL may pass through second masking device 3. In this case, the EUV radiation EL may pass through the slit (see slit 3s of FIG. 12) provided by the second masking device 3.

Figure 12:
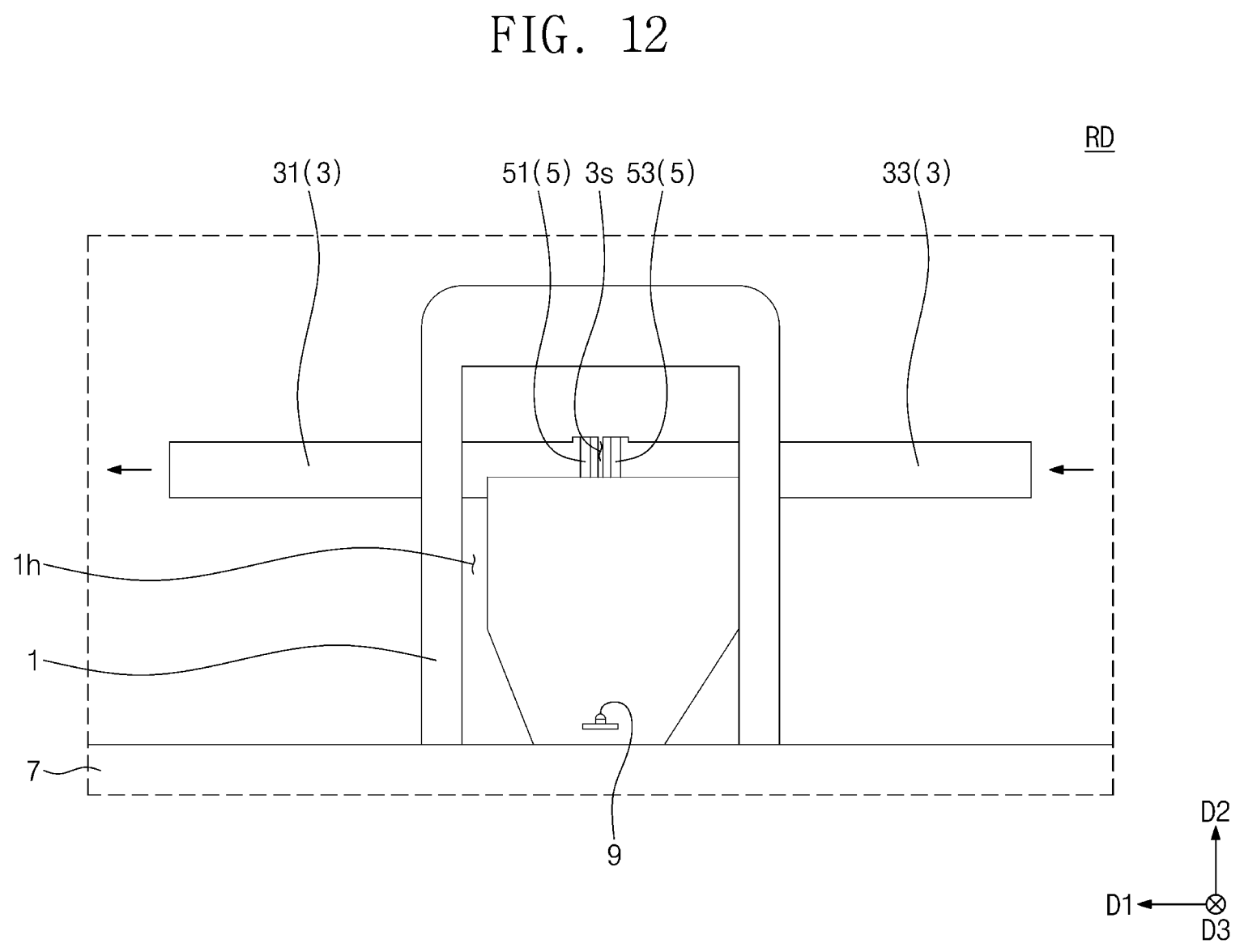
Figure 13:
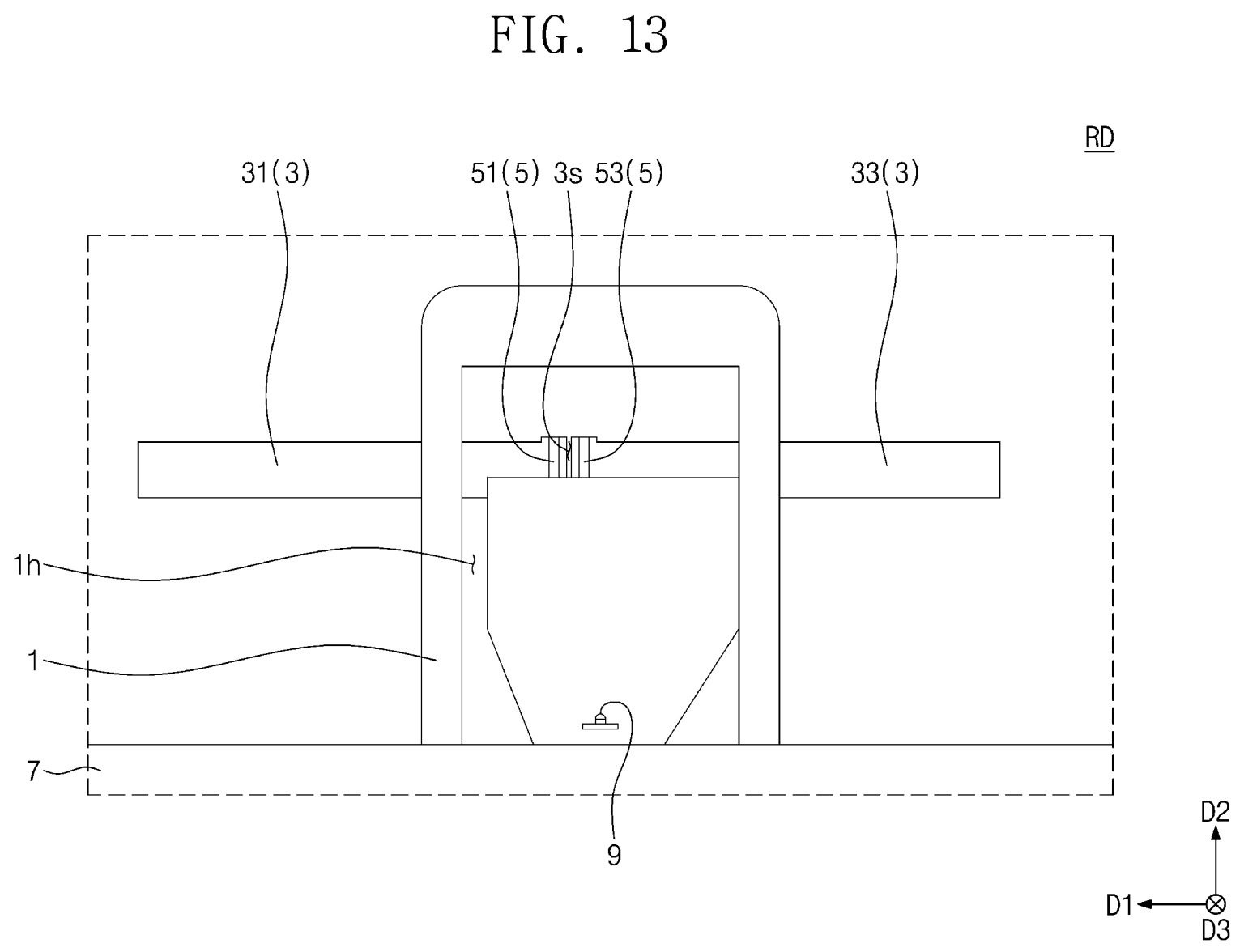

Referring to FIGS. 7, 12, and 13, the EUV measurement step Sb2 may include allowing the optical sensor device 5 to measure the EUV radiation that passes through the reticle masking device RD. For example, one or both of the first sensor 51 and the second sensor 53 may measure the EUV radiation that passes through the slit 3s.

The optical sensor movement step Sb3 may include driving the first sensor 51 and/or the second sensor 53 to move in the first direction D1. The driving mechanism 7 may drive the optical sensor device 5 to move in the first direction D1. For example, the optical sensor device 5 may move in the first direction D1 together with the second masking device 3. In this case, the second masking device 3 may cause the optical sensor device 5 to move in the first direction D1.

Referring to FIGS. 7 and 14, the intensity data obtainment step Sb4 may include obtaining a graph that shows distribution in the first direction D1 of intensity of the EUV radiation. The graph of FIG. 14 may express distribution of intensity of the EUV radiation. For example, in the graph of FIG. 14, a horizontal axis may denote a position in the first direction (see first direction D1 of FIG. 12). In FIG. 14, a leftward end of the graph may mean a leftward end point of the mask hole 1h depicted in FIG. 12. In FIG. 14, a rightward end of the graph may mean a rightward end point of the mask hole 1h depicted in FIG. 12. A vertical axis may denote intensity of the EUV radiation. As the optical sensor device (see optical sensor device 5 of FIG. 13) measures the EUV radiation while moving in the first direction D1, intensity of the EUV radiation may be measured differently at each point.

According to a reticle masking device, a substrate processing apparatus including the same, and a substrate processing method using the same in accordance with some embodiments of the present inventive concepts, intensity of EUV light may be measured at each region. Thus, it may be possible to determine which portion of the substrate processing apparatus is contaminated. Accordingly, only a contaminated region of the substrate processing apparatus may be cleaned and thus a prompt process may be possibly performed.

According to a reticle masking device, a substrate processing apparatus including the same, and a substrate processing method using the same in accordance with some embodiments of the present inventive concepts, an optical sensor device may be coupled to a second masking device, and therefore, the optical sensor device may become mobile. For example, only a simple design change may accomplish a movable sensor.

According to a reticle masking device, a substrate processing apparatus including the same, and a substrate processing method using the same in accordance with some embodiments of the present inventive concepts, a monitoring sensor may be used to ascertain whether an optical sensor device is contaminated. In addition, a cleaning fluid sprayer may be employed to clean the optical sensor device. It may thus be possible to exactly determine intensity of EUV light.

According to a reticle masking device of the present inventive concepts, a substrate processing apparatus including the same, and a substrate processing method using the same, it may be possible to ascertain a position of contamination in the substrate processing apparatus.

According to a reticle masking device, a substrate processing apparatus including the same, and a substrate processing method using the same, intensity of EUV light may be measured at each region.

According to a reticle masking device, a substrate processing apparatus including the same, and a substrate processing method using the same, only a simple design change may exactly measure EUV light.

Effects of the present inventive concepts are not limited to those mentioned above, other effects which have not been mentioned above will be clearly understood to those skilled in the art from the following description.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. A reticle masking device, comprising:
  a first masking device including a mask hole;
  a second masking device that is movable in a first direction with respect to the first masking device, the first direction being a horizontal direction; and
  an optical sensor device coupled to the second masking device,
  wherein the second masking device includes a slit that vertically penetrates the second masking device and overlaps the mask hole, and
  wherein the optical sensor device includes:
    a first sensor fixedly coupled to a bottom surface of the second masking device; and a second sensor disposed opposite to the first sensor across the slit and fixedly coupled to the bottom surface of the second masking device.

2. The reticle masking device of claim 1, wherein the second masking device includes:

a first member that extends in the first direction; and a second member that extends in the first direction and is spaced apart in the first direction from the first member, wherein, between the first member and the second member, the slit is defined by an inner lateral surface of the first member and an inner lateral surface of the second member.

3. The reticle masking device of claim 2, wherein the first sensor is fixedly coupled to a bottom surface of the first member, and wherein the second sensor is fixedly coupled to a bottom surface of the second member.

4. The reticle masking device of claim 1, further comprising a driving mechanism configured to drive the second masking device to move in the first direction.

5. The reticle masking device of claim 4, wherein the driving mechanism is configured to drive the first masking device to move in a second direction as a horizontal direction that intersects the first direction.

6. The reticle masking device of claim 1, wherein the second masking device is on a top surface of the first masking device.

7. The reticle masking device of claim 1, wherein a distance in the first direction between the first sensor and the second sensor is about 1.0 times to about 2.5 times a distance in the first direction of the slit.

8. The reticle masking device of claim 1, wherein a size of the mask hole is greater than a size of the slit.

9. A substrate processing apparatus, comprising:

an extreme ultraviolet (EUV) source;

a reticle stage configured to support a reticle;

a substrate stage configured to support a substrate; and a reticle masking device between the EUV source and the reticle stage, wherein the reticle masking device includes:

a first masking device including a mask hole;

a second masking device between the first masking device and the reticle stage and including a slit overlapping the mask hole, the second masking device being movable in a first direction as a horizontal direction; and an optical sensor device on a bottom surface of the second masking device, fixedly coupled to the second masking device, and movable in the first direction together with the second masking device, wherein the bottom surface of the second masking device faces the first masking device and wherein the optical sensor device includes a first sensor on one side of the slit.

10. The substrate processing apparatus of claim 9, wherein the optical sensor device further includes a second sensor on another side of the slit.

11. The substrate processing apparatus of claim 10, wherein a distance in the first direction between the first sensor and the second sensor is less than a width in the first direction of the mask hole.

12. The substrate processing apparatus of claim 10, wherein at least one of the first sensor and the second sensor includes a photodiode (PD).

13. The substrate processing apparatus of claim 9, further comprising:

a first reflection section between the EUV source and the reticle masking device, the first reflection section configured to reflect an EUV radiation toward the reticle stage, the EUV radiation being generated from the EUV source; and a second reflection section between the reticle stage and the substrate stage.

14. The substrate processing apparatus of claim 13, wherein each of the first reflection section and the second reflection section includes a plurality of optical members, and wherein each of the plurality of optical members includes a mirror or a lens.

15. A substrate processing method, comprising:

placing a substrate in a substrate processing apparatus;

irradiating an extreme ultraviolet (EUV) radiation to the substrate; and measuring the EUV radiation, wherein the substrate processing apparatus includes:

an EUV source;

a reticle stage that supports a reticle;

a substrate stage that supports the substrate; and a reticle masking device between the EUV source and the reticle stage, wherein the reticle masking device includes a first masking device, a second masking device between the first masking device and the reticle stage and an optical sensor device that is fixedly coupled to a bottom surface of the second masking device and movable in a first direction as a horizontal direction, wherein the bottom surface of the second masking device faces the first masking device, wherein the optical sensor device includes a first sensor, and wherein the measuring the EUV radiation includes:

allowing the reticle to receive the EUV radiation generated from the EUV source;

allowing the first sensor to measure the EUV radiation irradiated to the reticle; and driving the first sensor to move in the first direction.

16. The substrate processing method of claim 15, wherein measuring the EUV radiation further includes obtaining data on distribution in the first direction of intensity of the EUV radiation.

17. The substrate processing method of claim 15, wherein the first masking device includes a mask hole; and wherein the second masking device includes a slit overlapping the mask hole, and wherein the first sensor is coupled to the second masking device and adjacent to one side of the slit.

18. The substrate processing method of claim 17, wherein the optical sensor device further includes a second sensor, and wherein the first sensor and the second sensor are on opposite sides across the slit.

19. The substrate processing method of claim 17, wherein the first sensor is fixedly coupled to the bottom surface of the second masking device, and wherein the driving the first sensor to move in the first direction is performed by driving the second masking device to move in the first direction.

20. The substrate processing method of claim 15, wherein measuring the EUV radiation is performed in a state where the substrate is removed from the substrate stage.

* * * * *